United States Patent [19]
Pezzani

[11] Patent Number: 5,181,083
[45] Date of Patent: Jan. 19, 1993

[54] PIN DIODE WITH A LOW PEAK-ON EFFECT

[75] Inventor: Robert Pezzani, Vouvray, France

[73] Assignee: SGS-Thomson Microelectronics S.A., Gentilly, France

[21] Appl. No.: 730,167

[22] Filed: Jul. 15, 1991

[30] Foreign Application Priority Data

Jul. 16, 1990 [FR] France ................... 90 09342

[51] Int. Cl.⁵ ................... H01L 29/90; H01L 29/74
[52] U.S. Cl. ................... 257/491; 257/458; 257/656
[58] Field of Search ................... 357/13, 38, 58

[56] References Cited

U.S. PATENT DOCUMENTS 4,109,274  8/1978  Belenkov et al. ............ 357/38
4,267,557  5/1981  Muramoto et al. ........... 357/13
4,282,555  8/1981  Svedberg ..................... 357/38
4,309,714  1/1982  Slatter ........................ 357/22
4,672,402  6/1987  Yamaoka et al.

Primary Examiner—Jerome Jackson, Jr.
Attorney, Agent, or Firm—Lowe, Price, LeBlanc & Becker

[57] ABSTRACT

A PIN diode with a low voltage peak at the switching on comprises a P-type anode region (4) formed on a first surface of a low doped N-type substrate (1) and a cathode region (2) formed on the second surface of the substrate. The PIN diode comprises on a portion of the first surface an additional N+-type region (7) in contact with the anode region for forming a junction with the latter. The additional region is connected to the cathode region.

6 Claims, 1 Drawing Sheet

PIN DIODE WITH A LOW PEAK-ON EFFECT

BACKGROUND OF THE INVENTION

The present invention relates to the field of PIN diodes which are designed to allow a current associated with a first polarity to flow, and to block currents associated with reverse polarity.

FIG. 1 very schematically shows the general shape of a PIN diode. The diode comprises a low doped substrate 1, the doping level being usually referenced N− or I to indicate that the doping is close to the intrinsic level, for example $5.10^{14}$ atoms/cm$^3$. The rear surface of substrate 1 comprises an N+ layer with a highly doped level, for example $10^{21}$ atoms/cm$^3$. This surface is coated with a cathode metallization 3. In the front surface is formed a P-type region 4 on which is formed an anode metallization 5.

Normally, the voltage drop across the terminals of such a diode, when conductive, is about 0.6–0.7 volt. However, if a voltage is abruptly applied in the forward direction across the diode, an initial overvoltage peak (peak on), associated with the charges in the intrinsic area, appears.

FIG. 2 shows the voltage variation as a function of time when a direct voltage is abruptly applied across the diode. It can be noted that, during a period of about 200 ns, an initial overvoltage $V_p$ of about 10–50 volts can occur before decreasing again to the normal forward voltage $V_F$ of the diode.

This switching-on delay of the diode can be particularly impairing, for example when such a diode is associated in parallel with a protection component such as an avalanche thyristor.

Thus, an object of the invention is to provide a PIN diode structure avoiding the above peak on phenomenon.

BRIEF SUMMARY OF THE INVENTION

To attain this object, the invention provides a PIN diode with a low overvoltage at the switching on comprising a P-type anode region formed on a first surface of a low doped N-type substrate, a cathode region formed on the second surface of the substrate, and, on a portion of the first surface, an additional N+-type region in contact with the anode region for forming a junction with the latter, this additional region being connected to the cathode region.

In one application, this diode is reverse connected with an avalanche breakdown thyristor in a monolithic assembly.

BRIEF DESCRIPTION OF THE DRAWINGS

The foregoing and other objects, features and advantages of the invention will be apparent from the following detailed description of preferred embodiments as illustrated in the accompanying figures wherein:

FIG. 2 shows the voltage as a function of time across a PIN diode at the switching on;

Figure 1:
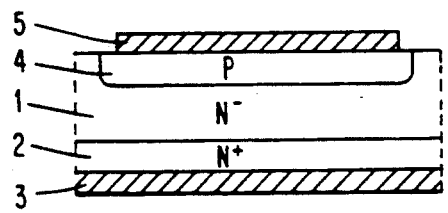
FIG. 1 is a section view of the conventional shape of a PIN diode.
Figure 2:
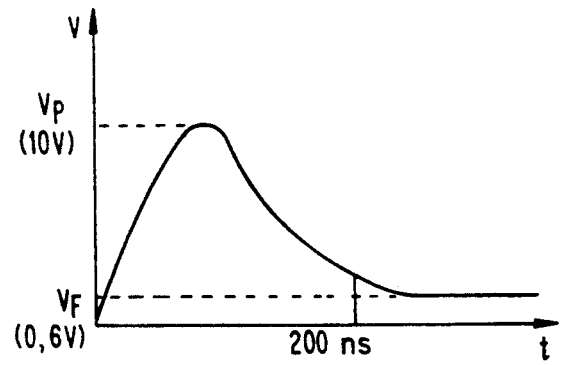

As conventional in integrated circuit representation, it will be noted that the thicknesses and lateral dimensions of the various layers are not drawn to scale in the section views of FIGS. 1, 3, 4 and 5. Some sizes are arbitrarily enlarged in order to facilitate the legibility and/or the drawing of these figures. Those skilled in the art will be able to refer to the exemplary values given in the present description and to the usual sizes in the technique.

DETAILED DESCRIPTION OF THE INVENTION

Figure 3:
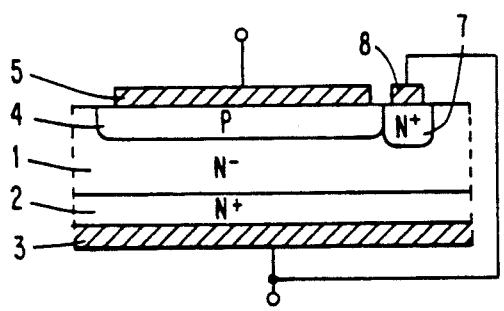
FIGS. 3 and 4 are section views of a first and a second embodiment of the invention.

FIG. 3 shows a first embodiment of the invention. In addition to the layers and metallizations 1–5 already illustrated in FIG. 1, the device of FIG. 3 comprises, near the upper surface of the PIN diode a highly doped N-type diffusion region 7 forming a junction with a portion of the P-type region 4. A metallization 8 is integral with the upper surface of region 7. This metallization 8 is connected to the cathode metallization of the diode.

Figure 4:
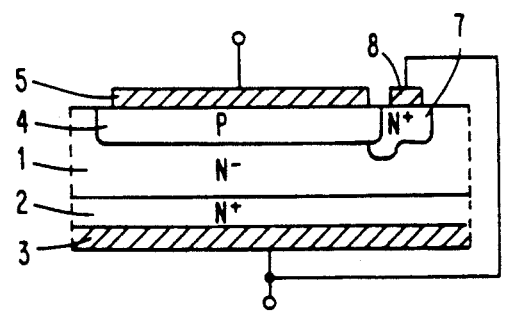

FIG. 4 shows another embodiment of the invention. The N+-type layer 7 is partially under region 4. This results from successive masking and doping steps, region 7 being first formed, then region 4.

With the invention, as soon as a voltage is applied across the anode and cathode terminals of the diode, the PN+ junction 4–7 is immediately conductive and imposes a low voltage across the device terminals. However, this small-size junction cannot allow a high current to flow and as soon as a sufficient number of carriers are injected into substrate 1, the PN−N+ vertical diode 4-1 2 becomes operative and the device operates as a conventional PIN diode wherein the initial peak on effect is avoided.

A diode according to the invention can be anti-parallel connected with an avalanche triggered gateless thyristor, this assembly being serially connected with a reverse-biased similar assembly for providing protection against positive or negative overvoltages.

Figure 5:
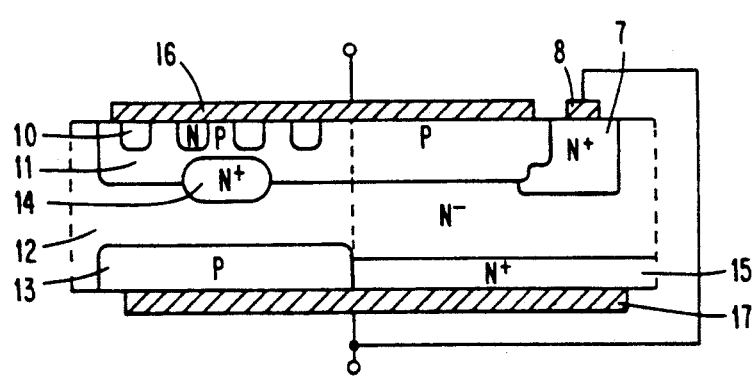
FIG. 5 is a section view of the monolithic assembly of a triggering device and a PIN diode according to the invention.

The parallel combination of an avalanche triggered thyristor with a diode is known per se, the invention consisting in modifying the diode. Thus, FIG. 5 shows in the left a thyristor comprising an N type upper layer with emitter shorts, a P-type layer 11, an N−-type substrate 12 and a lower P-type layer 13. An N+-type region 14 is often provided at a portion of the interface between layers 11 and 12 to set the thyristor breakdown voltage. The right portion of the figure shows a PIN diode formed from the P layer 11, substrate 12 and an N+ lower layer 15. An upper metallization 16 connects the anode of the diode to the cathode of the thyristor and a lower metallization 17 connects the cathode of the diode to the anode of the thyristor. Moreover, the right portion of the figure shows again the N+ region 7 according to the invention with its metallization 8 which is connected to metallization 17.

Figure 6:
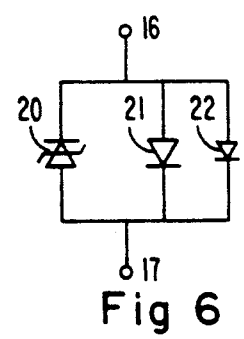
FIG. 6 shows a circuit equivalent to the structure of FIG. 5.

FIG. 6 shows the equivalent circuit of the assembly of FIG. 5. Between two electrodes 16 and 17, a thyristor 20 corresponds to the left portion of FIG. 5, a PIN diode 21 corresponds to junction 11/12 and a small PN+ diode 22 corresponds to junction 11/7.

Those skilled in the art will note that the invention is liable of various variants and particularly can profit from the various improvements generally brought to the achievement of PIN diodes which are described here only schematically.

I claim:

1. A PIN diode with protection against transient overvoltages comprising a P-type anode region formed above a low doped N-type substrate; a cathode region formed below the substrate; and an additional N+-type region forming a junction with the anode region; said additional region being connected to the cathode region through a path outside semiconductor regions of said diode of said substrate.

2. A PIN diode according to claim 1, anti-parallel connected with an avalanche breakdown thyristor in a monolithic assembly.

3. A semiconductor device having first and second terminals comprising:
   a low doped N-type substrate having a first surface and a second surface;
   a P-type region formed on said first surface above the substrate and connected to said first terminal;
   a N-type region formed on said second surface below the substrate and connected to said second terminal; and
   a means for reducing overvoltages developed at said first and second terminals as a result of changing a polarity of voltage applied between said first and second terminals, said means including an additional N-type region forming a junction with said P-type region and being directly connected to said second terminal through a path outside semiconductor regions of said semiconductor device.

4. A semiconductor device according to claim 3, connected in anti-parallel with an avalanche breakdown thyristor in a monolithic assembly.

5. A semiconductor diode having first and second terminals comprising:
   a low doped substrate of a first conductivity type having a first surface and a second surface;
   a region of a conductivity type opposite said substrate formed on said first surface above the substrate and connected to said first terminal;
   a region of the first conductivity type formed on said second surface below the substrate and connected to said second terminal; and
   a means for reducing transient overvoltages developed at said first and second terminals, said means including an additional region of the first conductivity type forming a junction with said region of the opposite conductivity type and being connected to said second terminal through a path outside semiconductor regions of said semiconductor diode.

6. A semiconductor diode according to claim 5, connected in anti-parallel with an avalanche breakdown thyristor in a monolithic assembly.

* * * * *